United States Patent [19]

Thorwarth

[11] Patent Number: 4,580,027

[45] Date of Patent: Apr. 1, 1986

[54] SOLDERING DEVICE AND METHOD OF SOLDERING

[75] Inventor: Ruediger Thorwarth, Glonn, Fed. Rep. of Germany

[73] Assignee: Siemens Aktiengesellschaft, Berlin and Munich, Fed. Rep. of Germany

[21] Appl. No.: 640,800

[22] Filed: Aug. 14, 1984

[30] Foreign Application Priority Data

Sep. 21, 1983 [DE] Fed. Rep. of Germany ....... 3334182

[51] Int. Cl.⁴ .............................................. B23K 3/00
[52] U.S. Cl. ............................... 219/85 M; 219/85 R; 219/85 F
[58] Field of Search ............... 219/85 R, 85 F, 85 M, 219/85 CA, 85 CM, 85 D, 119, 228, 229

[56] References Cited

U.S. PATENT DOCUMENTS 1,174,137  3/1916  Fulda ................................. 219/85 M
3,911,246 10/1975  Drinkard, Jr. ................ 219/85 R X

FOREIGN PATENT DOCUMENTS 546449  3/1977  U.S.S.R. ............................ 219/85 F

OTHER PUBLICATIONS

Frankland, H. G. and Sawyer, N. J., "Solder Joints 3—Techniques of Strengthening the Joints," (Mar. 1971), pp. 56–59.

Primary Examiner—C. L. Albritton
Assistant Examiner—C. M. Sigda
Attorney, Agent, or Firm—Hill, Van Santen, Steadman & Simpson

[57] ABSTRACT

A solder device and method in which the soldering element comprises two half shell-shaped soldering jaws which are formed of a electrically resistant material. During a soldering operation the jaws are closed and moved onto a soldering location to either melt solder located at the location or additional solder clamped in the jaws and to press a loop of a wire being soldered at the location. At the melting of the solder, the flow of current pulses stopped to allow the solder to solidify in the form of a cone which can be utilized in subsequent soldering operation as a centering arrangement or aid.

15 Claims, 5 Drawing Figures

SOLDERING DEVICE AND METHOD OF SOLDERING

BACKGROUND OF THE INVENTION

The invention is directed to a soldering device and method for making subsequent modification of a connection of a printed circuit board wherein a soldering element having a working surface for direct contact with a soldering location and a cavity opening toward the soldering location can be held in contact with the location and heated to a working temperature by means of electrical resistance heating.

Subsequent connection modifications between component terminals and interconnected terminals frequently have to be produced on the flow or solder side of a print circuit board equipped with components. To this end, the ends of an additional wire is stripped, tinned and rolled or pressed into a loop. The loop then serves a purpose of mechanically fixing the additional wire to the component terminal projecting from the circuit board. To heat the soldered location, electrical soldering bits having a tip with a hollow bore are employed and have a work surface which is placed on the solder location. The loop of the additional wires are mainly positioned during the soldering process. Since the soldering bit must be lifted from the molten solder, it is necessary to retain the additional wire until the solder has hardened; however, so-called dry joints then may occur. The fixing aids which were used for locating the loops of the additional wires can be eliminated as a result of shortening the component terminals so that they no longer project from the circuit board. In addition, unequipped feedthrough holes do not have any fixing aids for the additional wires. Furthermore, the solder deposits at the pads of the circuit boards, which deposits were created during the flow soldering process, are no longer adequate for embedding the loops of the additional wire when a plurality of additional wires are to be soldered onto the pad.

SUMMARY OF THE INVENTION

The object of the present invention is to create a soldering device suitable for the production of subsequent connection modifications on a circuit board with which under given conditions a plurality of additional wires can be solderd to a pad which does not have a fixing aid such as provided by a projecting component terminal and wherein the occurrence of dry joints can be reliably suppressed.

To accomplish these goals, the present invention is directed to an improvement in a soldering device for subsequent modification in the connection of a printed circuit board comprising a solder element having a working surface for direct contact with a soldering location and a cavity opening toward said location, said element being heated to a working temperature by means of electrical resistance heating. The improvements comprise the element being formed by two half shell-shaped soldering jaws, each consisting of a electrically resistant material; means for moving the jaws between an open and closed position; means for moving the jaws against the solder location; and each of the jaws being connected to a current source and having a shape to cause electrical resistant heating in the region of the working surface so that the working surface of each jaw is heated when a current passes through the jaw.

The advantages obtained from this invention particularly consist wherein a solder cone, which embeds the loop of the additional wire, can be formed with soldering jaws in a closed condition by means of solder which is introduced into the cavity of the soldering jaws. The solder cones then serve as a solder store as well as a centering aid when contacting further additional wires. An appearance of a dry joint is suppressed because the close soldering jaws serve as hold-down means for the lead during the soldering process and maintain this function until the solder has hardened. The soldering jaws are not opened and removed from the solder location until the solder has solidified. The inventive soldering means, however, can also be employed for connecting additional wires to component terminals which project from the printed circuit board. When so doing, however, no additional solder is introduced into the soldering jaw. The soldering jaw embraces the component terminal and serves as a hold-down means during the soldering process and during the cooling process.

According to another further development of the invention, the soldering jaws can be resiliently pressed against the solder location. With the means for moving the jaws against the location having a resilient or biasing means, the soldering jaws will act better for holding down the loop during a soldering operation.

Preferably, each of the soldering jaws has a slot which terminates above the work surface so that each of the jaws will have two portions or parts which are connected by a portion adjacent the work surface. Thus, when each of the two parts is connected to the current source, the current passes directly through the region above and adjacent to the work surface to uniformly heat the work surface to the required working temperature.

A controllable transformer is preferably utilized for each soldering jaw so that a controlled heating to the required working tempterature can be obtained. The working temperature, which remains constant over the duration of the soldering time, can also be set with the assistance of a thermocouple which is applied to one of the soldering jaws. In this case both of the soldering jaws are connected to a common control device. It is desirable for each soldering jaw to be heated by means of a current pulse. The power and the time duration of the current pulse can then be controlled by means of a clock arrangement in a simple fashion.

The invention is also directed to a method for soldering additional wires to pads of a printed circuit boards utilizing the inventive soldering device. The method starts with the step of providing a definite amount of core solders between the soldering jaws. Then the soldering jaws are closed and heated with the current pulse so that the solder pinched in the cavity of the soldering jaws melts and a drop of solder is formed and projects downward from the work surface. After the drop of solder has solidified, the soldering jaws are pressed against a pad occupied by the loop of the additional wire and the soldering jaws are again heated with the current pulse to melt the drop of solder with the stopping of the current pulse, the soldering jaws are retained on the pad until the solder has solidified. The appearance of dry joints is thereby reliably suppressed by means of the use of the soldering jaws as a hold-down arrangement. The formation of the drop of solder has the advantage that after it has solidified, it can be utilized as a centering aid when lowering the soldering jaws onto the pad occupied by the loop of the additional wire. When the drop of solder is remelted, the the solder jaw forms a solder cone which embeds the loop of the additional wire. After the solidification of the solder, the soldering jaws can then be expediently opened and lifted from the pad.

The solder cone formed on the pad while soldering an additional wire can then be advantageously utilized both as a centering aid as well as a solder store when soldering still further additional wires. When soldering further additional wires, their loops are then preferably first placed around the solder cone. Then the closed soldering jaws are lowered and heated with the current pulse for melting the soldered cones. After the stopping of the current pulse, the soldered jaws will remain on the pad until the solder has again hardened.

DESCRIPTION OF THE PREFERRED EMBODIMENTS

Figure 1:
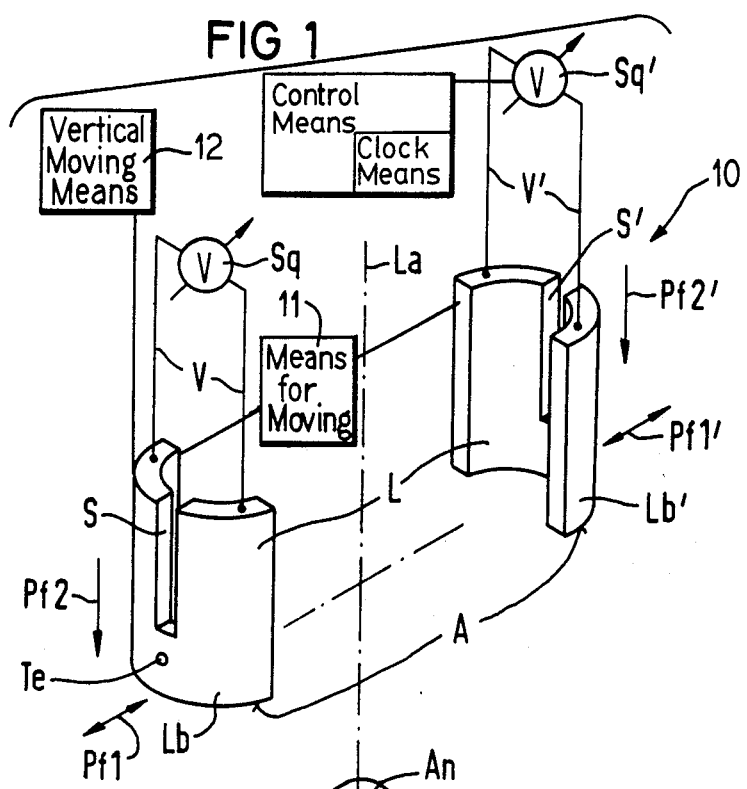
FIG. 1 is a perspective view of the open soldering jaws of the soldering device of the present invention positioned above a soldering pad of a printed circuit board.
Figure 2:
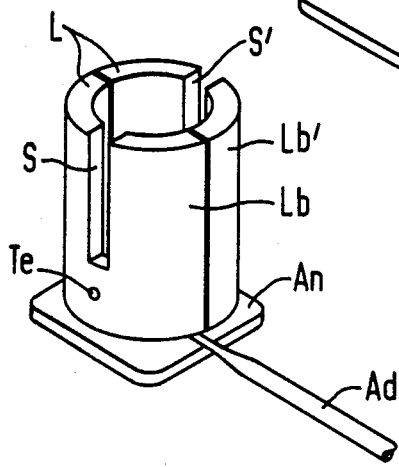
FIG. 2 is a perspective view of the soldering jaws in a closed position resting on the pad.

The principles of the present invention are particularly useful in a soldering device generally indicated at 10 and schematically illustrated in FIG. 1. Device 10 has a soldering element L which is formed by two half shell-shaped soldering jaws Lb and Lb', which have C-shaped cross-sections. The combined lower surfaces of the two soldering jaws Lb and Lb form an annular working surface A of the soldering element L which has an axis La. The two soldering jaws Lb and Lb' are displaced relative to each other in a horizontal direction of the double arrows Pf1 and Pf1' so that the jaws may be moved from the open position illustrated in FIG. 1 to a closed position such as illustrated in FIG. 2. In order to move the jaws in a horizontal direction, means for moving, which is schematically illustrated as a box 11, is provided. In addition, the device 10 can include means for moving both of the jaws in a direction Pf2 and Pf2' against a pad An which is a soldering location. As illustrated in FIG. 1, the means for moving the jaws in a vertical direction is illustrated by a box 12 and is capable of resiliently pressing the jaws against the solder location such as the pad An.

Each of the soldering jaws Lb and Lb' consists of a material having an electrical resistance such as for example titanium or a high temperature CrNi steel. In addition, each of the jaws Lb and Lb' has a slot S or S', respectively, which extends parallel to the axis La and terminates at a point spaced above the work surface A. The slots S and S' respectively separate their respective jaws Lb and Lb' into two parts which are connected to variable voltage sources Sq and Sq' by electrical lines V and V' respectively. Each of these current sources Sq and Sq', which are schematically illustrated in FIG. 1, consists of a separately controllable transformer whereby the heating of the soldered jaws Lb and Lb', respectively, occurs by means of current pulses. The chronological duration and the power of the current pulses can be controlled by clock means. A thermocouple Te, which is schematically illustrated in the drawings, can also be attached to the soldering jaw Lb in order to obtain a working temperature that is constant and controllable over the duration of the soldering time. In this case, both soldering jaws Lb and Lb' are connected with a common control device. Because of the slot S and S', the current entering in one part of each jaw must flow adjacent the working surface A to reach the other part. Thus, the slots insure that the working surfaces are heated by the resistance to the flow of the current pulse through the electrical resistance material.

When additional wires are to be soldered to a pad An, a defined or specific amount of core solder is first introduced between the open solder jaws Lb and Lb'. Then the soldering jaws Lb and Lb' are subsequently closed so that the soldering element L assumes the shape of a hollow cylinder whose vertical longitudinal axis La extend through the center of the pad An. After this closing operation, the soldering jaws Lb and Lb' are heated by means of corresponding current pulses so that solder pinched in the cavity of the solder element L is melted and a drop of solder, which is formed due to the surface tension of the molten solder, extend out of the working surface A. When the current pulses are stopped and after the drop of solder has hardened, the soldering jaws Lb and Lb' are lowered in the direction of arrows Pf2 and Pf2' by the vertical means 12 for moving and are resiliently pressed against the pad An which is occupied by a tinned loop of a additional wire that is not illustrated in FIG. 1. The solidified drop of solder serves as a centering aid. Subsequently thereto, the soldering jaws Lb and Lb' are again heated with a current pulse so that the drop of solder is melted. The closed soldering element L is pressed against the pad An and thereby serves as a hold-down means for the additional wire Ad as illustrated in FIG. 2. The soldering element L is left in its position until the solder solidifies after the current pulses are stopped. The soldering jaws Lb and Lb' of the soldering element L are subsequently opened and lifted from the pad An. It may be seen from FIG. 3 that the solder cone Lk in which the loop of the additonal wire Ad is embedded was formed by the soldering jaws when the drop of solder solidified.

Figure 3:
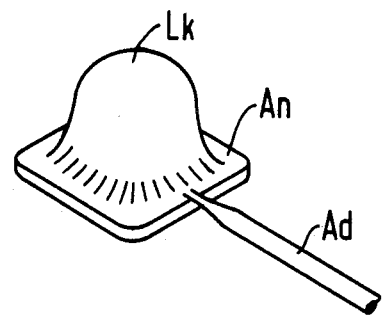
FIG. 3 is a perspective view of a solder cone formed on the pad with additional wire embedded therein in accordance with the present invention.
Figure 4:
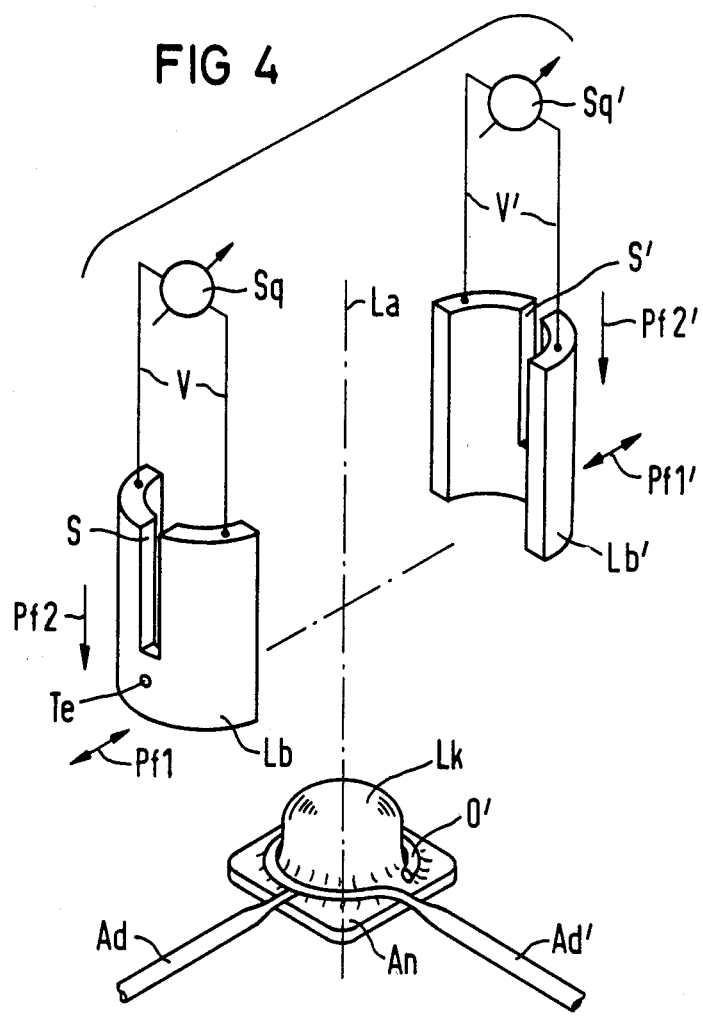
FIG. 4 is a perspective diagrammatic view of the open soldering jaws when applying still further wire on the pad.
Figure 5:
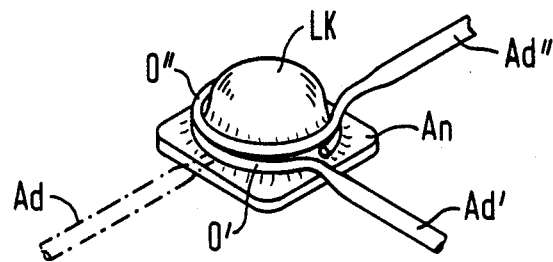
FIG. 5 is a perspective view showing two further additional wires being positioned on a pad.

As illustrated in FIG. 3, the solder cone Lk which was formed in soldering the additional wire Ad, can be employed both as a centering aid and as a solder store when soldering yet additional wires Ad' (FIG. 4). To this end, the tinned loop 0' of the additional wire Ad' is postioned on the solder cone Lk. The soldering jaws Lb and Lb' are then closed in the direction of the double arrows Pf1 and Pf1' and lowered onto the solder cone Lk in the direction of the arrows Pf2 and Pf2' respectively. The means 12 will have the jaws resiliently pressed against the pad An. Subsequently thereto the soldering jaws Lb and Lb' are heated with a current pulse for melting the solder cone Lk. The soldering jaws Lb and Lb' thereby serve as a hold-down means for the lead Ad and for the additional lead Ad' until the solder has completely hardened after stopping the current pulses. The soldering jaws Lb and Lb' are then opened and lifted from the pad An after the solidification of the solder. The loop not visible in FIG. 4 of the wire Ad and the loop O' of the change wire Ad' are then embedded in the solder cone which has been duly formed by melting of the solder cone Lk in the solder jaws Lb and Lb'. As illustrated in FIG. 5, two additional wires Ad' and Ad" can all be positioned on the solder cone Lk with their loops or ears O' and O" being received on the cone after the wire Ad had been soldered onto the pad An. The soldering of the additional wires Ad' and Ad" then occurs in one work step in the above described manner by means of melting the solder cone Lk. The soldering jaws Lb and Lb' will serve as hold-down means for the additional wires Ad' and Ad" until the newly formed solder cone has solidified.

The additional wire Ad is shown in dashed lines in FIG. 4. This is meant to indicate that only the solder cone Lk was first formed on the pad An. The loops O' and O" of the additional wires Ad' and Ad" respectively are then positioned on the solder cone. After heating, the loops are embedded in the solder cone which was newly formed as a result of melting the solder cone Lk. The forming of the solder cone Lk can thus occur by itself and does not need to be formed during the soldering of an additional wire Ad to the pad.

The described soldering means, however, can also be utilized for connecting additional wires to component terminals that project out from a printed circuit board. Additional solder is therefore not introduced into the soldering jaws Lb and Lb'. The soldering jaws Lb and Lb' are thus used to embrace the component terminal and melt the solder deposit as a result of the flow solder process. The soldering jaws Lb and Lb' thereby serve as hold-down means for the additional wire during the cooling process in a matter already described.

When a plurality of additional wires are to be soldered to a component terminal projecting from a printed circuit board, then the amount of solder deposit during the flow solder process maybe inadequate. In this case, a solder cone is formed under conditions described hereinabove with the soldering of the first additional wire to the component terminal. The solder cone then serves as a centering aid and as a solder store when soldering the subsequent change or additional wires.

In the above description, it should be noted that the soldering jaws have a current pulse passed therethrough to cause heating during melting of the solder and that the flow of current is stopped when it is desired for the solder to cool either to form the drop projecting from the end of the work surface or after the drop has been formed on the soldering pad.

Although various minor modifications may be suggested by those versed in the art, it should be understood that I wish to embody within the scope of the patent granted hereon, all such modifications as reasonably and promptly come within the scope of my contribution to the art.

I claim:

1. In a soldering device for subsequent modification of a connection on a printed circuit board comprising a soldering element having a working surface for direct contact with a soldering location and a cavity opening toward said location, said element being heated to a working temperature by means of electrical resistance heating, the improvements comprising the element being formed by two half shell-shaped soldering jaws, each soldering jaw having a C-shaped cross-section with a working surface and consisting of an electrically resistant material, means for moving the jaws between an open and closed position, means for moving the jaws against the soldering location, and each of the jaws being separately connected to a separate current source and having a shape to cause electrical resistant heating in a region adjacent the working surface so that the working surface of each jaw is heated when the current passes through the jaw.

2. In a soldering device according to claim 1 wherein the means for moving the jaw against the soldering location resiliently presses the soldering jaws against the soldering location.

3. In a soldering device according to claim 1, wherein each of the soldering jaws has a slot extending parallel to an axis of the element and terminating at a point spaced from the working surface to separate the jaw into two parts, said two parts being connected to be current source so that the current flowing through the jaw flows close to the working surface.

4. In a soldering device according to claim 1 wherein each of the soldering jaws is connected to the current source formed by a controlled transformer.

5. In a soldering device according to claim 1, which includes a thermocouple attached to one of the soldering jaws, said thermocouple being connected to control means to maintain the working temperature constant over the duration of the soldering time.

6. In a soldering device according to claim 5, wherein each soldering jaws is heatable by means of a current pulse.

7. In a soldering device according to claim 6 wherein the control means includes clock means for controlling the chronological duration of the current pulse and the power thereof.

8. In a soldering device according to claim 1, wherein each of the soldering jaws has a slot extending parallel to an axis of the soldering element and terminating at a point spaced from the working surface, said slot dividing each jaw into two parts connected to a current source, said current source creating a current pulse for heating the soldering jaw.

9. In a device according to claim 8, which includes control means having clock means for controlling the duration and power of each current pulse.

10. In a soldering device according to claim 8, wherein the current source comprises a controlled transformer for each of the soldering jaws.

11. A method for soldering additional wires to a soldering location of a printed circuit board utilizing a soldering device having two half shell-shaped soldering jaws with C-shaped cross-sections and working surfaces consisting of electrical resistant material, means for moving the soldering jaws between an open and closed position with the closed position forming a cylindrical shape with a cavity opening toward the soldering location, each of the jaws being connected to a current source so that the working surface of each jaw is heated when the current pulses from the source passes through the jaws, said method comprising the steps of placing a definite amount of coil solder between the open soldering jaws, closing the jaws on the solder, energizing the current source to produce the current pulses to heat and melt the solder pinched in the cavity of the soldering jaws, stopping the flow of the current pulses through the soldering jaw to allow the temperature to decrease and the solder to solidify in a drop which projects from the working surface, then positioning a loop of an additional wire on a pad and holding the projecting drop of solder of the jaws against the loop and pad, passing a current pulse through the jaws to heat and melt the solder, stopping the current pulse and maintaining the soldering jaw pressing against the pad until the solder has hardened to press the loop onto the pad and to form a soldering cone on the pad.

12. A method according to claim 11, which includes subsequent to solidification of the soldering cone on the pad, spreading the soldering jaws to an open position and then lifting the jaws from the pad.

13. A method according to claim 12, wherein subsequent to lifting the jaws from the pad, positioning loops of at least one further additional wire on the soldering cone, then closing the soldering jaws and lowering them onto the cone to hold the loop of the additional wire, passing a current pulse through the jaws to melt the soldering cone, stopping the flow of current pulses and holding the soldering jaws to maintain the loops of the wires on the pad until the solder solidifies.

14. A method according to claim 11, wherein the solidifying solder remains as a cone after removal of the jaws and said method includes utilizing the cone of said solder as a centering aid when soldering further additional wires to the soldering location.

15. A method according to claim 14, wherein the further additional wires have a loop positioned on the soldering cone and are secured to the soldering location positioning the jaws on the soldering cone, passing a current pulse through the jaws to heat the soldering cone while holding the loop of the additional wire on the pad, then stopping the flow of current pulses to allow the solder to solidify to secure the wires to the pad.

* * * * *